United States Patent
Park

(10) Patent No.: US 9,646,697 B2
(45) Date of Patent: May 9, 2017

(54) VOLTAGE SWITCHING CIRCUIT AND SEMICONDUCTOR APPARATUS INCLUDING THE SAME

(71) Applicant: SK hynix Inc., Icheon-si, Gyeonggi-do (KR)

(72) Inventor: Myung Jin Park, Icheon-si (KR)

(73) Assignee: SK hynix Inc., Icheon-Si (KR)

(*) Notice: Subject to any disclaimer, the term of this patent is extended or adjusted under 35 U.S.C. 154(b) by 57 days.

(21) Appl. No.: 14/696,638

(22) Filed: Apr. 27, 2015

(65) Prior Publication Data

US 2016/0180935 A1    Jun. 23, 2016

(30) Foreign Application Priority Data

Dec. 18, 2014  (KR) .......... 10-2014-0183336

(51) Int. Cl.

| | |
|---|---|
| *G11C 16/08* | (2006.01) |
| *G11C 16/30* | (2006.01) |
| *H03K 3/356* | (2006.01) |
| *G11C 8/08* | (2006.01) |
| *H01L 27/115* | (2017.01) |
| *G11C 16/10* | (2006.01) |
| *H01L 27/11521* | (2017.01) |

(52) U.S. Cl.
CPC ............... *G11C 16/08* (2013.01); *G11C 8/08* (2013.01); *G11C 16/30* (2013.01); *H03K 3/356017* (2013.01); *G11C 16/10* (2013.01); *H01L 27/115* (2013.01); *H01L 27/11521* (2013.01)

(58) Field of Classification Search
CPC .. H01L 27/115; H01L 27/11521; G11C 16/10
USPC ................................................. 365/185.05
See application file for complete search history.

(56) References Cited

U.S. PATENT DOCUMENTS

2012/0008391 A1* 1/2012 Lee .......................... G11C 8/08
                                                               365/185.05

FOREIGN PATENT DOCUMENTS

| KR | 1020120005815 A | 1/2012 |
|---|---|---|
| KR | 1020130031483 A | 3/2013 |

* cited by examiner

*Primary Examiner* — Jason Lappas
(74) *Attorney, Agent, or Firm* — William Park & Associates Ltd.

(57) ABSTRACT

A voltage switching circuit includes: a control signal generation block configured to include a high voltage switching block which controls an electric current flowing according to a high voltage in response to a voltage level of a low voltage control signal and generates complementary high voltage control signals; and a high voltage transfer block configured to be driven according to the complementary high voltage control signals, and generate a switching signal, the voltage level of which is raised based on the high voltage so that the switching signal has substantially the same level as the high voltage.

6 Claims, 4 Drawing Sheets

VOLTAGE SWITCHING CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2014-0183336 filed on Dec. 18, 2014, in the Korean Intellectual Property Office, which is incorporated herein by reference in its entirety.

BACKGROUND

1. Technical Field

Various embodiments generally relate to an integrated circuit, and more particularly to a high voltage switching circuit and a semiconductor apparatus including the same.

2. Related Art

A semiconductor apparatus may be either memory or non-memory apparatus. A semiconductor memory apparatus may be subdivided into two classes. A volatile memory apparatus is a memory that loses its contents unless it is electrically refreshed continuously, whereas a nonvolatile memory apparatus retains its contents even in the absence of a power supply.

Dynamic random access memory ("DRAM"), which is the most common kind of volatile memory apparatus, may be used as a computer memory. A flash memory apparatus, which is the most common kind of nonvolatile memory apparatus, is being widely used as a data storage device.

A modern semiconductor apparatus operates under a low supply voltage range. A semiconductor apparatus, however, may require high voltages for internal operations. For example, high voltages are needed to program or erase flash memories.

Under the condition where a semiconductor apparatus operates under a wide voltage range, efficient and reliable voltage switching must be guaranteed.

SUMMARY

In an embodiment, a voltage switching circuit comprising: a control signal generation block configured to include a high voltage switching block which controls an electric current flowing according to a high voltage in response to a voltage level of a low voltage control signal and generates complementary high voltage control signals; and a high voltage transfer block configured to be driven according to the complementary high voltage control signals, and generate a switching signal, the voltage level of which is raised based on the high voltage so that the switching signal has substantially the same level as the high voltage.

In an embodiment, a semiconductor memory apparatus comprising: a controller; a memory region including a plurality of semiconductor memory cells which are electrically coupled between a plurality of word lines and a plurality of bit lines, and configured to be controlled by the controller; a voltage providing block configured to provide a high voltage according to control signals of the controller; a row selection block including a high voltage switching block which generates a low voltage control signal by decoding an address signal according to control signals of the controller and generates complementary high voltage control signals based on the low voltage control signal and the high voltage, and configured to generate a switching signal, the voltage level of which is raised based on the complementary high voltage control signals and the high voltage so that the switching signal has substantially the same level as the high voltage; and a block switch configured to be driven by the switching signal, and transfer the high voltage to the memory region.

DETAILED DESCRIPTION

Figure 1:
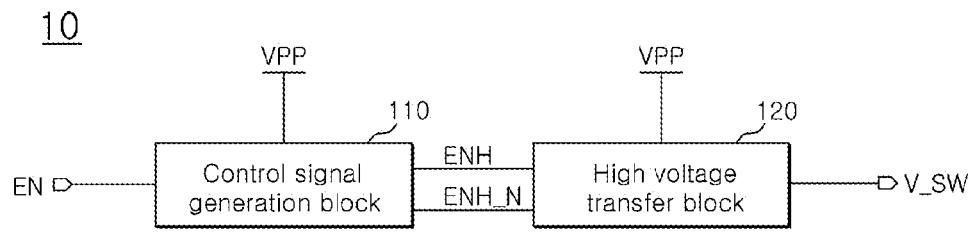
FIG. 1 is a configuration diagram illustrating an example of a voltage switching circuit in accordance with an embodiment.

FIG. 1 is a configuration diagram illustrating an example of a voltage switching circuit in accordance with an embodiment.

In an embodiment, a high voltage switching circuit 10 is provided as an example of a voltage switching circuit.

Referring to FIG. 1, the high voltage switching circuit 10 in accordance with an embodiment may include a control signal generation block 110 and a high voltage transfer block 120.

The control signal generation block 110 may be driven according to a low voltage control signal EN, and generate complementary high voltage control signals ENH and ENH_N based on a high voltage VPP supplied thereto.

The high voltage transfer block 120 may be driven according to the complementary high voltage control signals ENH and ENH_N, and generate a switching signal V_SW, which is raised up to the high voltage VPP, based on the high voltage VPP supplied thereto.

In an embodiment, the control signal generation block 110 may include a high voltage switch capable of controlling an electric current flowing according to the high voltage VPP in response to a voltage level of the low voltage control signal EN. For example, the control signal generation block 110 may include a depletion type high voltage switch ("DHVN").

The DHVN has a characteristic that a threshold voltage thereof always has a negative value, for example, approximately −2V to −3V. Therefore, even when a voltage of 0V is applied to the gate terminal thereof, current may flow through the DHVN. The DHVN may output an output voltage by controlling the current flowing according to a supplied voltage in response to a voltage applied to the gate terminal, and an output voltage of the DHVN may be a level that is acquired by subtracting the threshold voltage from the gate voltage.

Figure 2:
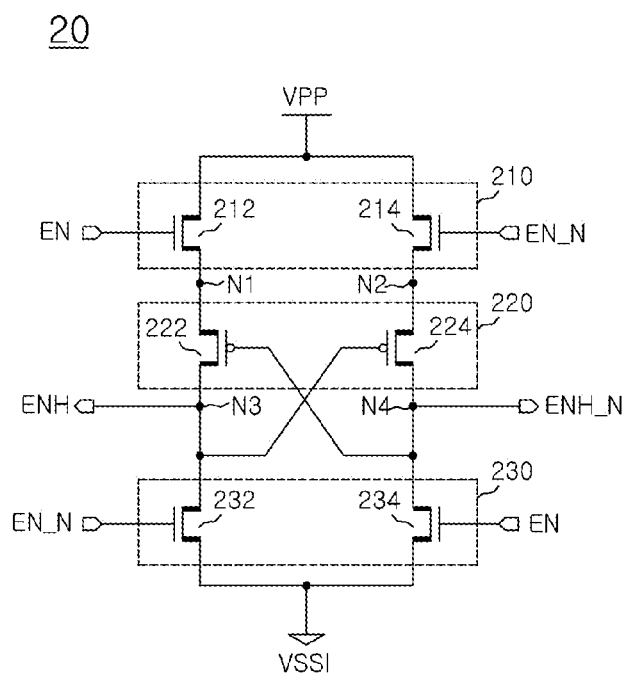
FIG. 2 is a configuration diagram illustrating an example of a control signal generation block in accordance with an embodiment.

In an embodiment, the control signal generation block 110 may be configured as shown in FIG. 2.

The control signal generation block 20 shown in FIG. 2 may include a current amount control unit 210, an output unit 220, and a sink unit 230.

The current amount control unit 210 may be electrically coupled to a voltage supply terminal, which supplies the high voltage VPP. In an embodiment, the current amount control unit 210 may include a first depletion type high voltage switch 212 and a second depletion type high voltage switch 214.

The first depletion type high voltage switch 212 may be electrically coupled between the voltage supply terminal of the high voltage VPP and a first node N1, and be driven in response to the low voltage control signal EN. The second depletion type high voltage switch 214 may be electrically coupled between the voltage supply terminal of the high voltage VPP and a second node N2, and be driven in response to an inverted low voltage control signal EN_N.

The output unit 220 may be electrically coupled between the current amount control unit 210 and output terminals. In an embodiment, the output unit 220 may include a first high voltage switch 222 and a second high voltage switch 224.

The first high voltage switch 222 may be electrically coupled between the first node N1 and a first output terminal N3, and driven according to a voltage at a second output terminal N4 and output the high voltage control signal ENH through the first output terminal N3. The second high voltage switch 224 may be electrically coupled between the second node N2 and the second output terminal N4, and may be driven according to a voltage at the first output terminal N3 and output the inverted high voltage control signal ENH_N through the second output terminal N4.

The sink unit 230 may be electrically coupled between the output unit 220 and a ground voltage terminal (e.g., an internal ground voltage terminal VSSI), and include a third high voltage switch 232 and a fourth high voltage switch 234.

The third high voltage switch 232 may be electrically coupled between the first output terminal N3 from which the high voltage control signal ENH is outputted and the internal ground voltage terminal VSSI, and be driven in response to the inverted low voltage control signal EN_N. The fourth high voltage switch 234 may be electrically coupled between the internal ground voltage terminal VSSI and the second output terminal N4 from which the inverted high voltage control signal ENH_N is outputted, and be driven in response to the low voltage control signal EN.

In an initial state in which the low voltage control signal EN is not applied, a voltage corresponding to the level acquired by subtracting the threshold voltage from the gate voltage of the first depletion type high voltage switch 212 may be applied to the first node N1. Similarly, a voltage corresponding to the level acquired by subtracting the threshold voltage from the gate voltage of the second depletion type high voltage switch 214 may be applied to the second to node N2.

If the low voltage control signal EN is enabled to a high level, a voltage at the first node N1, which is an output node of the first depletion type high voltage switch 212, may be obtained by subtracting the threshold voltage of the first depletion type high voltage switch 212 from a voltage level of the low voltage control signal EN. Also, since the third high voltage switch 232 is turned off and the fourth high voltage switch 234 is turned on, the first high voltage switch 222, which is driven according to a voltage at the second output terminal N4, is turned on, whereas the second high voltage switch 224, which is driven according to a voltage at the first output terminal N3, is turned off. Accordingly, an electric potential of the first node N1 is transferred to the first output terminal N3 through the first high voltage switch 222, and the second output terminal N4 has a low level.

In an embodiment, the low voltage control signal EN may have an internal power supply voltage level (e.g., approximately 2.3V), and the threshold voltage of the first and second depletion type high voltage switches 212 and 214 may be approximately −3V. Therefore, a voltage of approximately 5V may be applied to the first node N1. As a result, a voltage level of the high voltage control signal ENH outputted from the first output terminal N3 may be approximately 5V.

The high voltage control signal ENH may be used as a driving voltage of high voltage switches formed in the high voltage transfer block 120, and accordingly, the high voltage transfer block 120 may generate the switching signal V_SW of a first level from the high voltage VPP.

Figure 3:
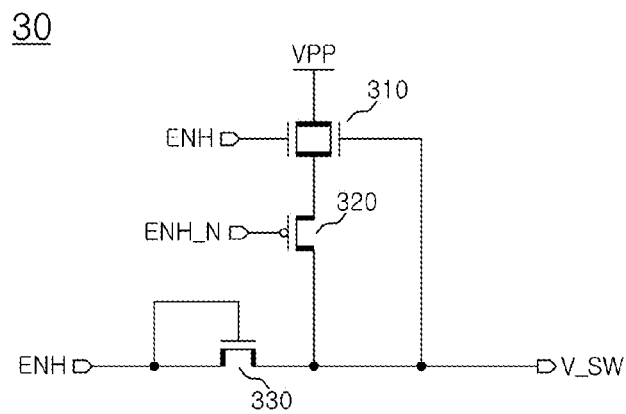
FIG. 3 is a configuration diagram illustrating an example of a voltage transfer block in accordance with an embodiment.

FIG. 3 is a configuration diagram illustrating an example of a high voltage transfer block in accordance with an embodiment.

The high voltage transfer block 30 in accordance with an embodiment may include a high voltage supply unit 310, an on/off unit 320, and a source level providing unit 330.

The high voltage supply unit 310 may be supplied with the high voltage VPP, and be driven by the high voltage control signal ENH and a voltage level which is applied through a feedback network coupled to an output terminal of the switching signal V_SW.

The on/off unit 320 may be electrically coupled between the high voltage supply unit 310 and the output terminal of the switching signal V_SW. The on/off unit 320 may transfer a voltage, which is generated by the high voltage supply unit 310, to the output terminal of the switching signal V_SW in response to the inverted high voltage control signal ENH_N.

The source level providing unit 330 may be electrically coupled between the supply terminal of the high voltage control signal ENH and the output terminal of the switching signal V_SW.

In an embodiment, the high voltage supply unit 310 may include a depletion type high voltage switch, which receives the high voltage control signal ENH through a first gate node, the switching signal V_SW through a second gate node, and is supplied with the high voltage VPP of the first level.

The on/off unit 320 may include a high voltage switch which receives the inverted high voltage control signal ENH_N through the gate terminal thereof. Also, the source level providing unit 330 may include a high voltage switch of which source and gate terminals are electrically coupled to an input terminal of the high voltage control signal ENH.

In an embodiment, the control signal generation block 110 in FIG. 1 or the control signal generation block 20 in FIG. 2 may generate the high voltage control signal ENH having a voltage of approximately 5V and the inverted high voltage control signal ENH_N having a low level.

The high voltage supply unit 310 provides a voltage, which is acquired by subtracting the threshold voltages thereof from a voltage level of the high voltage control signal ENH, to the output terminal of the switching signal V_SW through the on/off unit 320. The voltage at the output terminal of the switching signal V_SW may be applied to the high voltage supply unit 310 through a feedback network.

In the case where the low voltage control signal EN is disabled and the inverted low voltage control signal EN_N is enabled to a high level, the on/off unit 320 may be turned off by the inverted high voltage control signal ENH_N, and the high voltage supply path may be blocked.

A low voltage switch with a thin gate oxide layer may have a low breakdown voltage. When a control signal generation block, which includes such a low voltage switch, uses a intermediate voltage that is in between a low voltage and a high voltage, it may be difficult for the control signal generation block to convert the low voltage control signal EN into the high voltage control signal ENH by using the intermediate voltage due to the low breakdown voltage of the low voltage switch.

In an embodiment, the high voltage VPP with a level higher than the intermediate voltage, for example, a level equal to or larger than approximately 10V, is supplied, and the level of the low voltage control signal EN is raised through high voltage switches including depletion type high voltage switches and is generated as the high voltage control signal ENH.

Therefore, stability in operating the control signal generation blocks 110 and 20 and reliability of various switch circuits which use the switching signal V_SW as a driving voltage may increase.

A nonvolatile memory apparatus such as a flash memory apparatus, which use a high voltage for operations such as a program operation and an erase operation, may employ the high voltage switching circuit in accordance with an embodiment to provide the high voltage.

Figure 4:
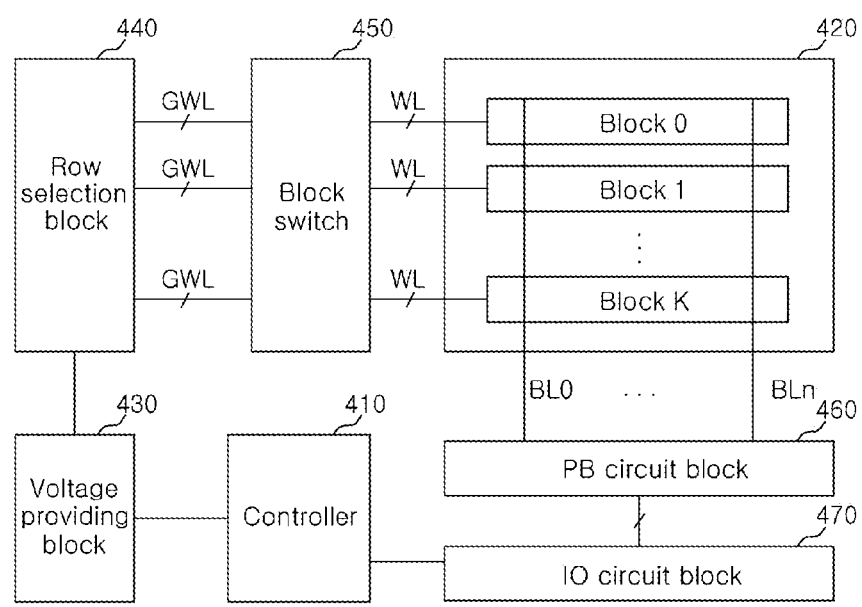
FIG. 4 is a configuration diagram illustrating an example of a nonvolatile memory apparatus in accordance with an embodiment.

FIG. 4 is a configuration diagram illustrating an example of a nonvolatile memory apparatus in accordance with an embodiment.

A nonvolatile memory apparatus 40 may include a controller 410, a memory region 420, a voltage providing block 430, a row selection block 440, a block switch 450, a page buffer circuit block 460, and an input/output circuit block 470.

The controller 410 may control general operations of the nonvolatile memory apparatus 40 according to external control signals.

The memory region 420 may include a plurality of blocks, each of which includes a plurality of memory cells coupled in series. Here, the plurality of memory cells may form a string structure. The memory region 420 may include nonvolatile memory cells such as transistors having floating gates or charge-trapping layer that can be realized as single level cells or multi-level cells.

The voltage providing block 430 may amplify an external voltage according to control signals outputted from the controller 410. In an embodiment, the voltage providing block 430 may include at least one charge pump. The voltage providing block 430 may provide a high voltage of a preset level to the row selection block 440 according to an operation mode of the nonvolatile memory apparatus 40.

The row selection block 440 decodes a row address to access a memory cell of a memory cell block according to the control of the controller 410. The row selection block 440 may include a block decoder for selecting any one of a plurality of blocks and a row decoder for selecting any one of a plurality of global word lines GWL included in a selected block. The high voltage provided from the voltage providing block 430 may be applied to the global word line GWL selected by the row selection block 440.

The block switch 450 may be electrically coupled to the row selection block 440 through global word lines GWL and to the memory region 420 through local word lines WL. The block switch 450 may include a plurality of switches for electrically coupling or decoupling the global word lines GWL and the local word lines WL. If a certain global word line GWL of a specified block is selected by the row selection block 440, the switch electrically coupled to the selected global word line GWL is turned on. Then, the high voltage applied to the global word line GWL by the voltage providing block 430 may be provided to the local word line WL coupled to a corresponding memory cell.

In an embodiment, the nonvolatile memory apparatus 40 may additionally include global drain select lines and local drain select lines (not shown in drawings) between the row selection block 440 and the memory region 420. The block switch 450 may additionally include drain select switches and electrically couple or decouple the global drain select lines and the local drain select lines. In an embodiment, the nonvolatile memory apparatus 40 may additionally include global source select lines and local source select lines (not shown in drawings) between the row selection block 440 and the memory region 420. The block switch 450 may additionally include source select switches and electrically couple or decouple the global source select lines and the local source select lines.

The page buffer circuit block 460 may be electrically coupled to the bit lines BL coupled to the memory region 420, and transmit and receive data to and from the input/output circuit block 470.

A signal for turning on switches in the block switch 450 coupled to the global word line GWL selected by the row selection block 440 (e.g., a block switch control signal) may be provided from the row selection block 440. For example, the row selection block 440 may generate a low voltage control signal by decoding an address signal, convert the low voltage control signal into a high voltage control signal based on the high voltage provided from the voltage providing block 430, and generate the block switch control signal based on the high voltage control signal and the high voltage.

The row selection block 440 may include the high voltage switching circuit described above with reference to FIGS. 1 to 3.

The block switch 450 may transfer a high voltage to the word line WL selected by the row selection block 440. In an embodiment, the block switch 450 may include a plurality of high voltage switches, which are driven by the block switch control signal and are capable of providing the high voltage applied to the global word lines GWL, to the local word lines WL. The high voltage switches may have high breakdown voltages that can transfer high voltages equal to or larger than approximately 20V.

Even a semiconductor memory apparatus operating under a low supply voltage range may need a voltage higher than the supply voltage range. For example, a nonvolatile memory apparatus such as a flash memory apparatus use a high voltage higher than external supply voltages at program and erase operations.

In the program, read, and erase operations of the nonvolatile memory apparatus 40, a high voltage should be supplied to the word line WL of memory cells, and this may be implemented through the row selection block 440. The high voltage provided from the row selection block 440 which may include the high voltage switching circuit shown in FIGS. 1 to 3 may be stably provided as the driving voltage and the input voltage of the high voltage switches configuring the block switch 430.

Figure 5:
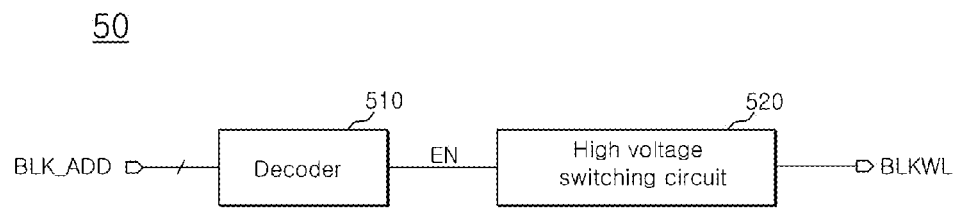
FIG. 5 is a configuration diagram illustrating an example of a row selection block in accordance with an embodiment.

FIG. 5 is a configuration diagram illustrating an example of a row selection block 50 in accordance with an embodiment. The row selection block 50 may include a decoder 510 and a high voltage switching circuit 520.

The decoder 510 may decode a block address signal BLK_ADD according to the address signal provided from a controller, and generate a low voltage control signal EN.

The high voltage switching circuit 520 may convert the low voltage control signal EN into a high voltage control signal, and generate a block switch control signal BLKWL, which has a high voltage level generated based on a high voltage (e.g., VPP), in response to the high voltage control signal.

In an embodiment, the high voltage switching circuit 520 may adopt the high voltage switching circuit 10, 20 and 30 described above with reference to FIGS. 1 to 3. In this case, the output signal of the high voltage switching circuit 520 may be a signal corresponding to the switching signal V_SW described above with reference to FIGS. 1 to 3.

Figure 6:
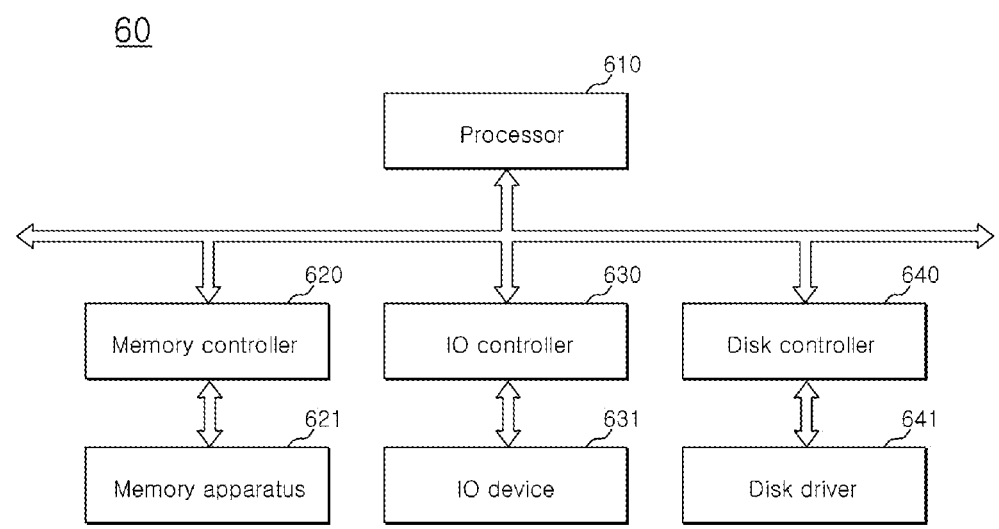
FIG. 6 is a configuration diagram illustrating an example of an electronic system in accordance with an embodiment.

FIG. 6 is a configuration diagram illustrating an example of an electronic system in accordance with an embodiment.

An electronic system 60 in accordance with an embodiment may include a processor 610, a memory controller 620, a memory apparatus 621, an IO controller 630, an IO device 631, a disk controller 640, and a disk driver 641.

The processor 610 may operate independently or in cooperation with another processor. The processor 610 may communicate with the memory controller 620, the IO controller 630 and the disk controller 640 through a bus (e.g., a control bus, an address bus, or a data bus).

The memory controller 620 may control the memory apparatus 621. For example, the memory controller 620 receives a request from the processor 610, and controls the memory apparatus 621 based on the request.

The memory apparatus 621 may be a nonvolatile memory apparatus including the high voltage switching circuit described above with reference to FIGS. 1 to 3, or the nonvolatile memory apparatus described above with reference to FIGS. 4 and 5.

The IO controller 630 may interface between the processor 610 and the IO device 631. The IO controller 630 may receive requests from the IO device 631 and input the requests to the processor 610. Also, the IO controller 630 may provide information outputted from the processor 610 to the IO device 631. The IO device 631 may include an input device such as a keyboard, a mouse, a touch screen and a microphone and an output device such as a display device and a speaker.

The disk controller 640 may control at least one disk driver 641 according to requests from the processor 610.

In such an electronic system 60 where the memory apparatus 621 performs a program, read or erase operation for under the control of the processor 610, and a high voltage is needed in such operations, a high voltage switching circuit may generate complementary high voltage control signals in response to a low voltage control signal, which is generated based on external address signal, and a high voltage (e.g., VPP). Further, a switching signal having a high voltage level is generated based on the complementary high voltage control signals and the high voltage (e.g., VPP). This switching signal may be used to operate a switch for supplying a high voltage to the word line of a memory cell to access (e.g., a block switch). In an embodiment, a circuit, which converts the low voltage control signal into the high voltage control signals, may include a high voltage switch capable of controlling the current flowing according to a high voltage according to the level of the low voltage control signal. For example, the circuit for converting the low voltage control signal into the high voltage control signals may include a depletion type high voltage switch ("DHVN"), thereby ensuring a stable high voltage switching operation.

Figure 7:
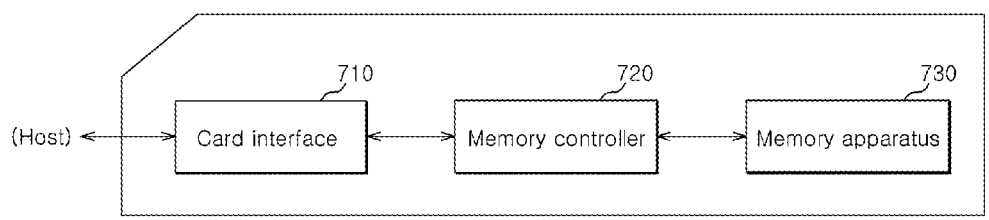
FIG. 7 is a configuration diagram illustrating an example of an electronic device in accordance with an embodiment.

FIG. 7 is a configuration diagram illustrating an example of an electronic device in accordance with an embodiment.

The electronic system 70 shown in FIG. 7 may include a card interface 710, a memory controller 720, and a memory apparatus 730.

The electronic system 70 shown in FIG. 7 illustrates an example of a memory card or a smart card, and may be any one of a PC card, a multimedia card, an embedded multimedia card, a secure digital card and a USB drive.

The card interface 710 interfaces data exchange between a host and the memory controller 720 according to the protocol of the host. In an embodiment, the card interface 710 may support the protocol used by the host, a software loaded on the hardware which supports the protocol used by the host, or a signal transmission scheme.

The memory controller 720 controls data exchange between the memory apparatus 730 and the card interface 710.

The memory apparatus 730 may be a nonvolatile memory apparatus including the high voltage switching circuit described above with reference to FIGS. 1 to 3, or the nonvolatile memory apparatus described above with reference to FIGS. 4 and 5.

When the memory apparatus 730 performs a program, read or erase operation according to a request from a host, a high voltage should be supplied to a memory cell to access. In an embodiment, when the memory apparatus 730 uses a high voltage, a high voltage switching circuit may generate complementary high voltage control signals in response to a low voltage control signal which is generated based on external address signal and a high voltage (e.g., VPP). Further, a switching signal having a high voltage level is generated based on the complementary high voltage control signals and the high voltage (e.g., VPP). This switching signal may be used to apply a high voltage to the word line of a memory cell to access (e.g. a block switch). In an embodiment, a circuit, which converts the low voltage control signal into the high voltage control signals, may include a high voltage switch capable of controlling the current flowing according to a high voltage according to the level of the low voltage control signal. For example, the circuit for converting the low voltage control signal into the high voltage control signals may include a depletion type high voltage switch ("DHVN"), thereby ensuring a stable high voltage switching operation.

While various embodiments have been described above, it will be understood to those skilled in the art that the embodiments described are by way of example only. Accordingly, the high voltage switching circuit and the nonvolatile memory apparatus including the same described herein should not be limited based on the described embodiments.

What is claimed is:

1. A voltage switching circuit comprising:
   a control signal generation block configured to include a high voltage switching block which controls an electric current flowing according to a high voltage in response to a voltage level of a low voltage control signal and generates complementary high voltage control signals; and
   a high voltage transfer block configured to be driven according to the complementary high voltage control signals, and generate a switching signal, the voltage level of which is raised based on the high voltage so that the switching signal has substantially the same level as the high voltage, wherein the high voltage switching block includes depletion type high voltage switches.

2. The voltage switching circuit according to claim 1, wherein the control signal generation block includes:
   a current amount control unit electrically coupled to a high voltage supply terminal, and configured to be driven according to the low voltage control signal;
   an output unit electrically coupled between the current amount control unit and output terminals, and configured to be driven according to a voltage at the output terminals; and
   a sink unit electrically coupled between the output unit and a ground voltage supply terminal, and configured to be driven according to the low voltage control signal.

3. The voltage switching circuit according to claim 1, wherein the control signal generation block comprises:
   a first depletion type high voltage switch electrically coupled to the high voltage supply terminal, and configured to be driven according to the low voltage control signal; and
   a second depletion type high voltage switch electrically coupled to the high voltage supply terminal, and configured to be driven according to an inverted low voltage control signal.

4. The voltage switching circuit according to claim 1, wherein the complementary high voltage control signals are respectively outputted through a first output terminal and a second output terminal, and
wherein the control signal generation block includes:
   a current amount control unit electrically coupled to a high voltage supply terminal, and configured to be driven according to the low voltage control signal;
   a first high voltage switch electrically coupled between the current amount control unit and the first output terminal, and configured to be driven according to a voltage at the second output terminal and output a high voltage control signal; and
   a second high voltage switch electrically coupled between the current amount control unit and the second output terminal, and configured to be driven according to a voltage at the first output terminal and output an inverted high voltage control signal.

5. The voltage switching circuit according to claim 1, wherein the complementary high voltage control signals are respectively outputted through a first output terminal and a second output terminal, and
wherein the control signal generation block includes:
   a third high voltage switch electrically coupled between the first output terminal and a ground voltage supply terminal, and configured to be driven according to the inverted low voltage control signal; and
   a fourth high voltage switch electrically coupled between the second output terminal and the ground voltage supply terminal, and configured to be driven according to the low voltage control signal.

6. The voltage switching circuit according to claim 1, wherein the control signal generation block comprises:
   a first completion type high voltage switch electrically coupled between the supply terminal of the high voltage and a first node, and configured to control an electric current flowing according to the high voltage in response to the voltage level of the low voltage control signal and transfer the electric current controlled by the first completion type high voltage switch to the first node;
   a second completion type high voltage switch electrically coupled between the supply terminal of the high voltage and a second node, and configured to control an electric current flowing according to the high voltage in response to the voltage level of the inverted low voltage control signal and transfer the electric current controlled by the second completion type high voltage switch to the second node;
   a first high voltage switch electrically coupled between the first node and a first output terminal, and configured to be driven according to a voltage at a second output terminal and transfer a voltage at the first node to the first output terminal; and
   a second high voltage switch electrically coupled between the second node and the second output terminal, and configured to be driven according to a voltage at the first output terminal and transfer a voltage at the second node to the second output terminal.

\* \* \* \* \*